US007864882B2

(12) United States Patent
Anderson et al.

(10) Patent No.: US 7,864,882 B2
(45) Date of Patent: *Jan. 4, 2011

(54) METHOD AND APPARATUS FOR GENERATING CONSTANT ENVELOPE MODULATION USING A QUADRATURE TRANSMITTER

(75) Inventors: George C. Anderson, Sunrise, FL (US); Jose E. Korneluk, Lake Worth, FL (US); Gregory S. Raven, Plantation, FL (US)

(73) Assignee: Motorola Mobility, Inc., Libertyville, IL (US)

( * ) Notice: Subject to any disclaimer, the term of this patent is extended or adjusted under 35 U.S.C. 154(b) by 754 days.

This patent is subject to a terminal disclaimer.

(21) Appl. No.: 11/618,772

(22) Filed: Dec. 30, 2006

(65) Prior Publication Data

US 2008/0160933 A1    Jul. 3, 2008

(51) Int. Cl.
*H04L 25/49* (2006.01)
*H04L 27/20* (2006.01)
*H04L 27/36* (2006.01)
*H03C 1/06* (2006.01)

(52) U.S. Cl. .................. 375/297; 375/298; 375/308; 332/162

(58) Field of Classification Search ............ 375/219, 375/222, 259, 260, 284, 285, 296–298, 300, 375/308; 330/149; 332/103, 162
See application file for complete search history.

(56) References Cited

U.S. PATENT DOCUMENTS

| 5,066,923 A | 11/1991 | Gailus et al. |
| 5,124,672 A | 6/1992 | Kuisma |
| 5,467,055 A | 11/1995 | Wray et al. |
| 5,564,087 A | 10/1996 | Cygan et al. |
| 5,745,523 A | 4/1998 | Dent et al. |
| 5,787,362 A | 7/1998 | Matero |
| 5,933,767 A | 8/1999 | Leizerovich |
| 6,418,173 B1 | 7/2002 | Matsuoka |
| 6,831,954 B1 | 12/2004 | Mandyam |
| 6,885,241 B2 | 4/2005 | Huang et al. |
| 7,012,970 B2 | 3/2006 | Greenwood et al. |

(Continued)

FOREIGN PATENT DOCUMENTS

DE    10 2004 001998 A1    9/2004

(Continued)

OTHER PUBLICATIONS

Patent Cooperation Treaty, "Notification of Transmittal of the International Search Report and the Written Opinion of the International Searching Authority" for International Application No. PCT/US2007/087084, Sep. 12, 2008, 13 pages.

(Continued)

*Primary Examiner*—Young T. Tse
(74) *Attorney, Agent, or Firm*—Scott M. Garrett; Sylvia Chen

(57) ABSTRACT

A multi-mode communication device (100) uses a quadrature transmitter (102) for transmitting both amplitude and constant envelope angle-modulated signals. For angle modulation, a separate feedback path is used from that used for amplitude modulated signal transmission. An FM receiver (136) is used to produce error signals (214, 216) used in correcting the I and Q quadrature signals (206, 208).

7 Claims, 3 Drawing Sheets

U.S. PATENT DOCUMENTS

| | | |
|---|---|---|
| 7,107,077 B2 | 9/2006 | Lee |
| 2004/0127173 A1 | 7/2004 | Leizerovich |
| 2004/0193965 A1 | 9/2004 | Coersmeier |
| 2005/0026570 A1 | 2/2005 | Han |
| 2005/0031044 A1 | 2/2005 | Gesbert et al. |
| 2005/0215206 A1 | 9/2005 | Granstrom et al. |
| 2006/0098761 A1* | 5/2006 | Leizerovich et al. ........ 375/303 |
| 2007/0253510 A1 | 11/2007 | Danz |
| 2008/0058003 A1 | 3/2008 | Rydnell et al. |
| 2008/0151974 A1* | 6/2008 | Jensen et al. ................ 375/219 |
| 2008/0160933 A1 | 7/2008 | Anderson et al. |

FOREIGN PATENT DOCUMENTS

| | | | |
|---|---|---|---|
| EP | 0588444 A | 3/1994 | |
| EP | 0665641 A2 | 8/1995 | |
| WO | 2005125143 A | 12/2005 | |
| WO | 2006031159 A | 3/2006 | |

OTHER PUBLICATIONS

U.S. Patent and Trademark Office, "Non-Final Rejection" for U.S. Appl. No. 11/618,777, Dec. 30, 2009; 12 pages.

Patent Cooperation Treaty; "Notification of Transmittal of the International Search Report and the Written Opinion of the International Searching Authority" for International Patent Application No. PCT/US2007/087219, Jun. 25, 2008, 13 pages.

United States Patent and Trademark Office, "Office Action Summary: Non-Final" for U.S. Appl. No. 10/985,409, Dec. 20, 2007, pp. 1-16, Alexandria VA USA.

United States Patent and Trademark Office, "Office Action Summary: Final", for U.S. Appl. No. 10/985,409, Jun. 13, 2008, pp. 1-15, Alexandria VA USA.

* cited by examiner

US 7,864,882 B2

METHOD AND APPARATUS FOR GENERATING CONSTANT ENVELOPE MODULATION USING A QUADRATURE TRANSMITTER

FIELD OF THE INVENTION

The invention relates generally to communications transmitters, and more particularly to transmitters in multi-mode communication devices having on-board quadrature modulators and which communicate using modes requiring constant envelope angle modulation.

BACKGROUND OF THE INVENTION

Mobile communication devices are increasingly common, particularly in metropolitan regions of the world. These devices have evolved from simple radio telephones to complex, multi-mode devices that may incorporate computing ability for executing applications and programs. Manufacturers have endeavored to include increased functionality in smaller volume while reducing power consumption to increase operation time for a given battery capacity.

The communications landscape has evolved as well, and there are now a variety of competing communications systems, protocols, and air interfaces offered in the marketplace. There are also different modes of communication and services available. Some manufacturers, rather than design mobile communication devices that only operate with one type of air interface and only offer one communication mode, are designing multi-mode communication devices that can access more than one type of communication system and communicate using more than one mode of communication.

In order to keep with goals of small size, weight, and low power consumption, however, manufacturers have had to design circuitry such that it can be used in as many of the different modes as possible. The fact that communication is now almost entirely digital allows much of the signal processing to be performed by processors, such as digital signal processor, according to instruction code. However, certain elements are difficult to share across different communication schemes. For example, a transmitter designed for amplitude modulation may not be a likely candidate for use with a communication protocol calling for angle modulation with a constant envelope. Typically for multi-mode devices using such diverse communication protocols manufactures have been forced to use separate transmitters for each modulation form. This is undesirable because transmitter components may be among the more costly components in the design of a communications device. Therefore there is a need for transmitter that can support multiple communication schemes having diverse modulations schemes.

SUMMARY OF THE INVENTION

The present invention discloses in a first embodiment a constant envelope IQ transmitter. The transmitter is comprised of an IQ signal source which generates an I baseband signal and a Q baseband signal from a circular IQ constellation. A summing junction is used to sum the I and Q baseband signals with I and Q error signals to produce corrected I and Q signals. An IQ modulator is used for modulating a carrier wave with the corrected I and Q signals to produce a substantially constant envelope IQ modulated carrier. An amplifier is then used for amplifying the constant envelope IQ modulated carrier to produce an output signal. The output signal is fed back through a directional coupler in the form of a sampled signal produced by the coupler. Feedback is accomplished through a frequency modulated (FM) receiver which is coupled to the directional coupler to receive the sampled signal and produce the I error and Q error signals.

In another embodiment of the invention, there is provided a method of generating an IQ modulated constant envelope signal in a transmitter, which commences by generating an I baseband signal and a Q baseband signal. The I and Q baseband signals are produced by mapping an input signal to a circular IQ constellation. The method commences further by summing the I and Q baseband signals with I and Q error signals to produce corrected I and Q signals. The I and Q error signals are produced by feedback through an FM receiver. The method further commences by modulating a carrier wave with the corrected I and Q signals to produce a constant envelope IQ modulated carrier. The IQ modulated carrier is then amplified at a power amplifier to produce an output signal. The output signal is an RF signal that is transmitted via an antenna. The feedback is accomplished by sampling the output signal to produce a sampled signal, and demodulating the sampled signal with an FM receiver to produce the I and Q error signals.

In another embodiment, the invention provides multi-mode communication device using a quadrature transmitter for both AM and constant envelope modulation transmission. The device includes a multi-mode transceiver. The multi-mode transceiver includes a quadrature modulator. The multi-mode transceiver is capable of transmitting both amplitude modulated and constant envelope angle modulated signals, alternatively, depending on a present mode of communication. The device further includes a Cartesian feed back path selectably coupled between an output and a back end module of the of the multi-mode communication device for providing quadrature feedback when the multi-mode transceiver is transmitting amplitude modulated signals. When operating in the constant envelope modulation mode, an FM receiver is selectably coupled between the output of the multi-mode transceiver and the back end module of the of the multi-mode transceiver and provides quadrature feedback in that mode. When operating in the constant envelope mode, the transmitter uses a circular IQ constellation for producing I and Q baseband signals, which are summed with I and Q error signals obtained from the FM receiver feedback path.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

While the specification concludes with claims defining features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention. It should further be noted that the acronym "FM" refers to angle modulation, more commonly called frequency modulation, and demodulation. It is generally absent of any intentional amplitude modulation.

Figure 1:
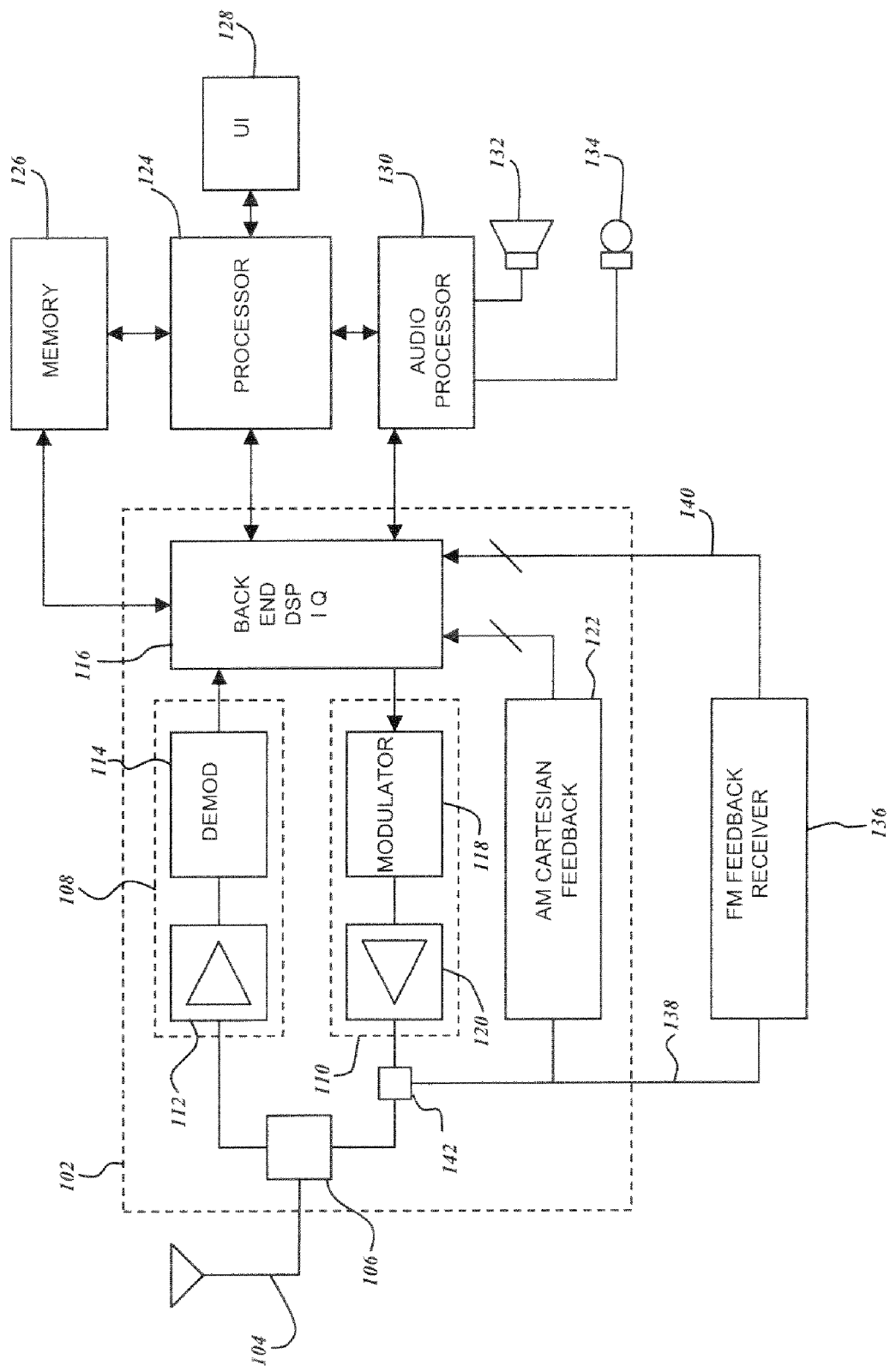
FIG. 1 shows a block schematic diagram of a multi-mode mobile communication device, in accordance with an embodiment of the invention.

Referring now to FIG. 1, there is shown a block schematic diagram of a multi-mode mobile communication device 100, in accordance with an embodiment of the invention. The multi-mode mobile communication device comprises a multi-mode communications transceiver 102 that is coupled to an antenna 104. The antenna is coupled via an isolator or switch 106 to a receiver 108 and a transmitter 110. The receiver includes an amplifier 112 such as a low noise amplifier, and a demodulator 114. The receiver amplifies a received radio frequency signal and provides the amplified signal to the demodulator, which demodulates the amplified signal. The demodulator may be a quadrature demodulator which provides I and Q baseband signals to a back end module 116 including a digital signal processor. The I and Q signals may be either analog or digital. If they are analog, the back end module will convert them to digital for processing. The back end module processes the output of the demodulator to obtain the information transmitted by the transmitting party from which the device is receiving. The processing may include, for example, removal of error correction coding, digital filtering, decoding of encoded voice information, and so on. Similarly, the back end module prepares signals for transmission by filtering, coding, and applying forward error correction, among other operations that may be performed. The back end module provides I and Q quadrature signals to a digital modulator 118. The modulator modulates a carrier with the I and Q signals to generate modulated radio frequency signal which is provided to a radio frequency power amplifier 120. The power amplifier amplifies the signal so that it may be radiated by the antenna at a desired power level.

To suppress distortion and non-linearity in the amplified signal, the transmitter may employ one of at least two feedback paths. More particularly, a Cartesian feedback path 122 for quadrature amplitude modulated (QAM) signals, may be selectively used when the device is operating in a communications mode requiring quadrature amplitude modulation and where the envelope of the transmitted signal exhibits amplitude variation. Cartesian feedback is well known for linearizing amplitude modulated quadrature signals.

The back end module is further coupled to a processor 124 which is responsible for controlling operation of the device in accordance with instruction code it instantiates and executes. The processor and back end module are coupled to a memory 126. The memory as shown here represents an aggregate memory, and includes a variety of memory elements including storage memory, execution memory, re-programmable memory, read only memory, and so on, as is well known. The processor operates a user interface 128 which may include well known user interface elements such as a graphical display, keypad and other buttons, a tactile alert generator, for example. These elements allow the user to interact with the device, receive information from the device, and enter information and commands into the device so that the device can carry out tasks desired by the user.

To facilitate voice and audio communication, the device further includes an audio processor 130. The audio processor is coupled to the processor 124 and back end module 116, and receives digital audio signals from the back end module or processor, or both, converts them to analog audio signals and plays the analog audio signals over a speaker 132 or other audio transducer. The audio processor may, for example, receive volume information from the processor and adjust the volume of the audio signals being played accordingly. Similarly, the audio processor may receive analog audio signals from a microphone 134 and convert them to digital form to be processed by the back end module for transmission, voice recognition, or other audio processing.

The device, in accordance with the invention, further comprises an FM receiver 136. The FM receiver may be integrated with Cartesian feedback circuitry 122 and multi-mode transceiver, dedicated for feedback operation, or it may be used for other FM receiving operations, such as, for example, receiving frequency modulated commercial broadcast radio signals, or communication signals transmitted in accordance with the Global Specification for Mobile communications (GSM). Accordingly, the FM receiver may operate in a frequency band that is substantially different than the band or bands used by the multi-mode transceiver communications 102.

IQ modulation, as employed in the multi-mode communications transceiver 102, is not conventionally used for constant envelope modulation because of the distortion and non-linearity introduced by the transmitter components. However, according to the invention, the FM receiver may be used to provide corrective feedback such that the IQ modulator can be used for constant envelope communications, such as GSM communication. The FM receiver is therefore coupled to the output of the power amplifier of multi-mode transceiver, as indicated by line 138. The coupling is through a directional coupler 142 or other coupling means, and is preferably switchable so that the FM receiver may be selectively coupled to the output of the power amplifier. The FM receiver demodulates the output of the power amplifier, and generates error signals I' and Q' which are fed back to the back end module 116 as indicated by line 140. These error signals are summed with the I and Q signals, respectively, generated at the back end module.

Figure 2:
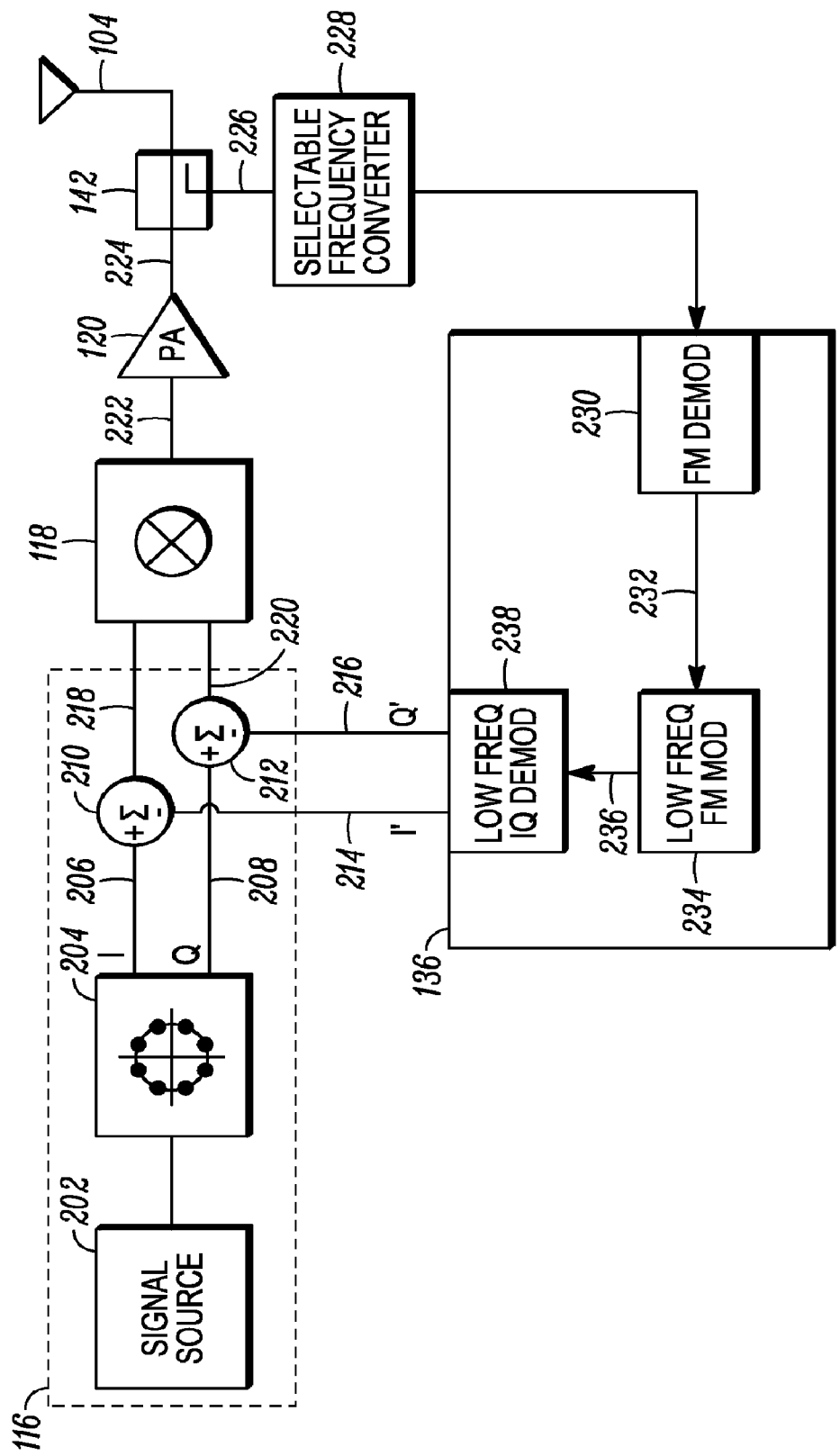
FIG. 2 shows a block schematic diagram of a transmitter arrangement for generating a constant envelope signal using IQ modulation, in accordance with an embodiment of the invention.

Referring now to FIG. 2, there is shown therein a block schematic diagram of a transmitter 200 in accordance with an embodiment of the invention. The transmitter is an IQ transmitter that is used to generate a constant envelope signal suitable for voice communication in GSM compliant communication systems. A signal source 202, such as a voice signal, provides a digital signal that is ready for transmission, meaning it has been otherwise processed, filtered, had forward error correction applied, etc., as necessary. The digital signal is mapped to an IQ constellation 204. In order to facilitate generation of the constant envelope signal, the constellation is a circular constellation, meaning every defined point is equidistant from the origin of the constellation. The output of the constellation mapping is an I baseband signal 206 and a Q baseband signal 208. These are fed to an I summer 210 and a Q summer 212, respectively. The I baseband signal is summed with an I' or I error signal 214, and the Q baseband signal is summed with a Q' or Q error signal 216. The result of these summations is a corrected I signal 218 and a corrected Q signal 220. The corrected I and Q signals are fed to the quadrature or IQ modulator 118. The IQ modulator generates an IQ modulated carrier 222. The IQ modulated carrier will typically not be a sufficiently constant envelope signal for a desired communication standard, and will exhibit phase distortion as well. The effect of the feedback of the I and Q error signals is such that corrected I and Q signals are effectively predistorted in a way such that the predistortion will essentially be eliminated upon the signal being modulated and amplified, resulting in a substantially constant envelope signal without phase distortion at the output 224 of the RFPA 120.

The output signal 224 is sampled, such as by a directional coupler 142 to provide a sampled signal 226. The sampled signal is a low level duplicate of the output signal 224. The sampled signal is fed back to the FM receiver 136. It is preferred that the sampled signal is switchably connectable to the FM receiver so that a different feedback path may be used with quadrature amplitude modulation signals.

It is contemplated that the output signal 224 may be at a frequency outside of the frequency band in which the FM receiver can receive. When the output signal is not within the band of operation of the FM receiver, a frequency converter 228 may be used to shift the frequency of the sampled signal to a frequency at which the FM receiver can receive. In one embodiment the frequency converter is a harmonic generator to shift the frequency of the sampled signal to a multiple of the carrier frequency. A diode may be used to generate the harmonic, for example. If the FM receiver is a dedicated FM receiver, and not used for other purposes, it may operate on the same carrier oscillator 221 as used by the IQ modulator 118.

The sampled signal is fed, after frequency shifting, if necessary, to FM demodulator 230. The FM demodulator produces a demodulated signal 232 that is fed, according to the present embodiment, to a low frequency FM modulator 234. The low frequency FM modulator uses a carrier that is at a significantly lower frequency than that used by the FM demodulator, and may be, for example, on the order of 100-500 KHz. The low frequency FM modulator produces a low frequency modulated FM signal 236 which is fed to a low frequency IQ demodulator 238, which performs quadrature demodulation to produce the error I and Q signals 214, 216.

Thus, the transmitter as configured in FIG. 2 facilitates generating a constant envelope signal using quadrature or IQ modulation that is sufficiently constant for use with standardized voice communication in systems such as those conforming to the GSM specification. The transmitter commences generating an I baseband signal and a Q baseband signal by mapping an input signal to a circular IQ constellation. The I and Q baseband signals are summed with I and Q error signals to produce a corrected I and Q signals. The corrected I and Q signals are used in modulating a carrier wave to produce a substantially constant envelope IQ modulated carrier, having some predistortion. The transmitter commences amplifying the constant envelope IQ modulated carrier at a power amplifier to produce an output signal. The output signal is sampled to produce a sampled signal. The feedback loop facilitates demodulating the sampled signal with an FM receiver to produce the I error and Q error signals.

Figure 3:
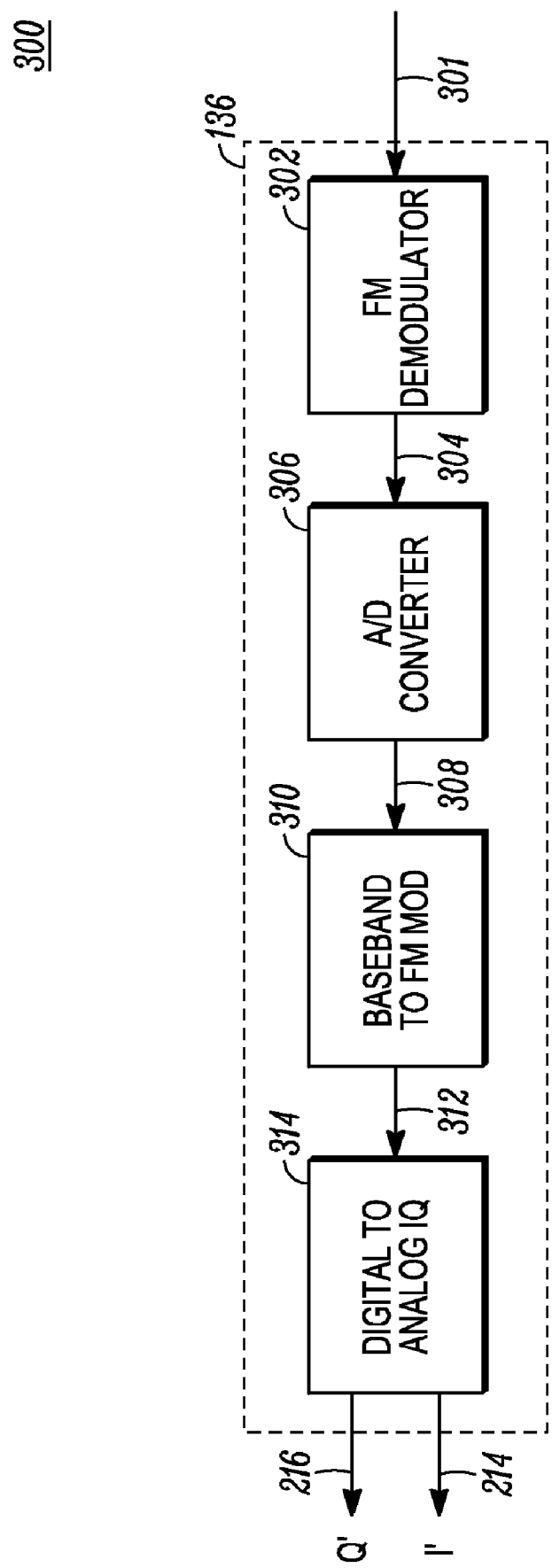
FIG. 3 shows an FM receiver for use in a multi-mode communication device, in accordance with an embodiment of the invention.

Referring now to FIG. 3, there is shown an alternative arrangement 300 of the FM receiver for providing quadrature feedback when the multi-mode communication device is transmitting constant envelope signals using the quadrature transmitter. The present embedment also uses an FM demodulator 302 for producing a demodulated signal 304. The demodulated signal is a "clean" quadrature base signal in analog form. The base signal is sampled and converted to digital form by an analog to digital converter 306, providing a digitized baseband signal 308. The digitized baseband signal 308 is fed to an FM modulator 310 which modulates the digitized baseband signal to produce a modulated digitized baseband signal 312. A digit to analog IQ converter 314 is then used to convert the modulated digitized baseband signal to the error I and error Q signals 214, 216.

This invention can be embodied in other forms without departing from the spirit or essential attributes thereof. Accordingly, reference should be made to the following claims, rather than to the foregoing specification, as indicating the scope of the invention.

What is claimed is:

1. A multi-mode communication device, comprising:
  a multi-mode transceiver including a quadrature modulator, the multi-mode transceiver capable of transmitting both amplitude modulated signals and constant envelope angle modulated signals alternatively;
  a Cartesian feedback path selectably coupled between transmitter output and a back end module of the multi-mode transceiver for providing quadrature feedback when the multi-mode transceiver is transmitting the amplitude modulated signals; and
  an FM receiver selectably coupled between the transmitter output of the multi-mode transceiver and the back end module of the multi-mode transceiver for providing quadrature feedback when the multi-mode transceiver is transmitting the constant envelope angle modulated signals.

2. A multi-mode communication device as defined in claim 1, further comprising a frequency converter selectably coupled between the transmitter output of the multi-mode transceiver and the FM receiver, and wherein the FM receiver operates at a prescribed frequency band, the frequency converter shifts a frequency of a sampled signal sampled from the transmitter output of the multi-mode transceiver to a frequency within the prescribed frequency band.

3. A multi-mode communication device as defined in claim 1, wherein the FM receiver comprises a GSM receiver.

4. A multi-mode communication device as defined in claim 1, wherein the multi-mode transceiver comprises:
  an IQ signal source which generates an I baseband signal and a Q baseband signal from a circular IQ constellation;
  a summing junction which sums the I baseband signal with an I error signal to produce a corrected I signal, and which sums the Q baseband signal with an Q error signal to produce a corrected Q signal;
  an IQ modulator which modulates a carrier wave with the corrected I and Q signals to produce a constant envelope IQ modulated carrier;
  an amplifier which amplifies the constant envelope IQ modulated carrier to produce an output signal; and
  a directional coupler which samples the output signal to produce a sampled signal,
wherein the FM receiver is selectively coupled to the directional coupler to receive the sampled signal and produce the I error and Q error signals.

5. A multi-mode communication device as defined in claim 4, wherein the IQ signal source generates the I and Q baseband signals by applying a digitized voice signal to the circular IQ constellation.

6. A multi-mode communication device as defined in claim 4, wherein the FM receiver comprises:
  an FM demodulator for demodulating the sampled signal and producing a demodulated signal;
  a low frequency FM modulator for modulating the demodulated signal with a low frequency carrier signal and producing a low frequency modulated signal; and a low frequency IQ demodulator for producing the I error and Q error signals from the low frequency modulated signal.

7. A multi-mode communication device as defined in claim 4, wherein the FM receiver comprises:
   an FM demodulator for producing a demodulated signal from the sampled channel;
   an analog to digital converter for converting the demodulated signal to a digitized baseband signal;
   an FM modulator for modulating the digitized baseband signal to produce a modulated digitized baseband signal; and
   a digit to analog IQ converter for converting the modulated digitized baseband signal to the I error and Q error signals.

* * * * *